United States Patent
Won et al.

(10) Patent No.: US 6,680,251 B2
(45) Date of Patent: Jan. 20, 2004

(54) METHODS OF CHEMICAL VAPOR DEPOSITING RUTHENIUM BY VARYING CHEMICAL VAPOR DEPOSITION PARAMETERS

(75) Inventors: Seok-jun Won, Seoul (KR); Cha-young Yoo, Kyungki-do (KR); Sung-tae Kim, Seoul (KR); Young-wook Park, Kyungki-do (KR); Yun-jung Lee, Seoul (KR); Soon-yeon Park, Daegu (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/080,000

(22) Filed: Feb. 21, 2002

(65) Prior Publication Data

US 2002/0137335 A1 Sep. 26, 2002

(30) Foreign Application Priority Data

Mar. 22, 2001 (KR) ......................... 2001-15001

(51) Int. Cl.[7] .............................................. H01L 21/44
(52) U.S. Cl. ................. 438/680; 438/681; 438/686; 438/778; 427/99; 427/255.28; 427/255.31; 427/255.7
(58) Field of Search ................. 438/680, 681, 438/686, 778; 427/99, 255.28, 255.31, 255.7

(56) References Cited

U.S. PATENT DOCUMENTS

| 5,231,056 A | 7/1993 | Sandhu ..................... 437/200 |
| 5,314,845 A | 5/1994 | Lee et al. .................... 438/238 |
| 5,626,906 A | 5/1997 | Summerfelt et al. ..... 427/126.3 |
| 5,637,533 A | 6/1997 | Choi |
| 5,821,152 A | 10/1998 | Han et al. .................... 438/398 |
| 5,885,867 A | 3/1999 | Shin et al. ................... 438/255 |
| 5,960,281 A | 9/1999 | Nam et al. ................... 438/255 |
| 6,004,858 A | 12/1999 | Shim et al. .................. 438/398 |
| 6,077,573 A | 6/2000 | Kim et al. .................... 427/578 |
| 6,087,226 A | 7/2000 | Kim et al. .................... 438/275 |
| 6,117,692 A | 9/2000 | Kim et al. ..................... 438/14 |
| 6,238,973 B1 | 5/2001 | Pyun .......................... 438/255 |
| 6,245,632 B1 | 6/2001 | Kim et al. .................... 438/398 |
| 6,281,125 B1 * | 8/2001 | Vaartstra et al. ............ 438/681 |
| 6,316,064 B1 * | 11/2001 | Onozawa et al. ............ 427/585 |
| 6,333,227 B1 | 12/2001 | Kim et al. .................... 438/255 |
| 6,380,080 B2 * | 4/2002 | Visokay ...................... 438/681 |
| 6,462,367 B2 * | 10/2002 | Marsh et al. ................ 257/295 |
| 6,479,100 B2 * | 11/2002 | Jin et al. ............... 427/255.31 |

FOREIGN PATENT DOCUMENTS

| JP | 6326249 | 11/1994 |
| JP | 7-94680 | 4/1995 |

(List continued on next page.)

OTHER PUBLICATIONS

Fukuzumi et al., *Liner–Supported Cylinder (LSC) Technology to Realize Ru/Ta$_2$O$_5$/Ru Capacitor for Future DRAMs*, IEEE International Electron Devices Meeting 2000, pp. 793–796.

(List continued on next page.)

*Primary Examiner*—David Nelms
*Assistant Examiner*—Reneé R. Berry
(74) *Attorney, Agent, or Firm*—Myers Bigel Sibley & Sajovec

(57) ABSTRACT

A layer is formed by chemical vapor depositing a seeding layer of ruthenium oxide on a substrate at a chemical vapor deposition flow rate ratio of a ruthenium source to oxygen gas. A main layer of ruthenium is chemical vapor deposited on the seeding layer by increasing the chemical vapor deposition flow rate ratio of the ruthenium source to the oxygen gas.

14 Claims, 10 Drawing Sheets

FOREIGN PATENT DOCUMENTS

| JP | 10-27888 | 1/1998 |
|----|----------|--------|
| JP | 10-270662 | 10/1998 |
| JP | 11-121711 | 4/1999 |
| JP | 11-150245 | 6/1999 |
| JP | 11-354751 | 12/1999 |
| KR | 1996-0042954 A | 12/1996 |
| WO | WO 00/13216 | 3/2000 |

OTHER PUBLICATIONS

Won et al., *Conformal CVD–Ruthenium Process for MIM Capacitor in Giga–bit DRAMs*, IEEE International Electron Devices Meeting 2000, pp. 789–792.

Tsuzumitani et al., *Extendibility of $Ta_2O_5$ Metal–Insulator–Metal Capaciotr Using Ru Electrode*, Abstract from Japanese Journal of Applied Physics, vol. 39, Part 1, No. 4B, Apr. 30, 2000, pp. 2073–2077.

Hiratani et al., *Hydrogen Reduction Properties of $RuO_2$ Electrodes*, Japanese Journal of Applied Physics, vol. 38, 1999, pp. L1275–L1277.

Lauth et al., *The Adsorption of Hydrogen on a Ruthenium (1010) Surface*, Journal of Chemical Physics, vol. 91, No. 6, Sep. 15, 1989, pp. 3729–3743.

Notice to Submit Response, Korean Application No. 10–2001–0015001, Jan. 29, 2003.

* cited by examiner

METHODS OF CHEMICAL VAPOR DEPOSITING RUTHENIUM BY VARYING CHEMICAL VAPOR DEPOSITION PARAMETERS

RELATED APPLICATION

This application claims the benefit of Korean Patent Application No. 2001-15001, filed Mar. 22, 2001, the disclosure of which is hereby incorporated herein by reference in its entirety as if set forth fully herein.

FIELD OF THE INVENTION

The present invention relates to chemical vapor deposition methods, and more particularly to methods for chemical vapor depositing ruthenium on a substrate.

BACKGROUND OF THE INVENTION

The noble metal ruthenium (Ru) is being widely investigated for use in conductive layers of integrated circuits. In particular, layers comprising ruthenium are being investigated for use as the lower (bottom) electrode of integrated circuit capacitors that may be used, for example, in Dynamic Random Access Memories (DRAM).

It is known to fabricate ruthenium layers by sputtering. Ruthenium layers formed by sputtering may have good surface morphology, low leakage and/or low resistance. However, ruthenium layers that are formed by sputtering may have poor step coverage. This poor step coverage may be disadvantageous when forming three-dimensional capacitor electrode structures, to obtain high capacitance, such as a cylinder-type capacitor electrode and/or a fin-shaped capacitor electrode.

It is also known to form a layer comprising ruthenium using Chemical Vapor Deposition (CVD). In chemical vapor deposition, ruthenium is deposited on an integrated circuit substrate, for example on an interlayer insulating layer of an integrated circuit substrate, using a gasified ruthenium source, and a reaction gas, also referred to as a catalyzer. This may produce a ruthenium layer that has good step coverage. Unfortunately, a ruthenium layer formed by chemical vapor deposition may have worse surface morphology than a ruthenium layer formed by sputtering. It, thus, may be difficult to obtain a desired leakage current characteristic or surface resistance using ruthenium layers formed by chemical vapor deposition.

SUMMARY OF THE INVENTION

Some embodiments of the invention form a layer comprising ruthenium by chemical vapor depositing a seeding layer comprising ruthenium oxide on a substrate at a chemical vapor deposition flow rate ratio of a ruthenium source to oxygen gas. A main layer comprising ruthenium is chemical vapor deposited on the seeding layer by increasing the chemical vapor deposition flow rate ratio of the ruthenium source to the oxygen gas. Layers comprising ruthenium that are so formed can have good step coverage and good surface morphology.

According to other embodiments of the invention, a chemical deposition rate remains constant above a breakpoint flow rate ratio of the ruthenium source to the oxygen gas, and increases below the breakpoint flow rate ratio. According to these embodiments, chemical vapor depositing a sealing layer is performed by chemical vapor depositing the seeding layer at a chemical vapor deposition flow rate ratio of ruthenium source to oxygen gas that is below the breakpoint flow ratio. The main layer is chemical vapor deposited by increasing the chemical vapor deposition flow rate ratio of the ruthenium source to the oxygen gas to above the breakpoint flow rate ratio.

According to other embodiments, the main layer is deposited by adjusting the flow rate of at least one of the ruthenium gas source and the oxygen gas. According to yet other embodiments, the seeding layer is chemical vapor deposited at a first pressure and at a first oxygen gas flow rate, and the main layer is chemical vapor deposited at a second pressure that is less than the first pressure, and at a second oxygen flow rate that is less than the first oxygen flow rate. In some embodiments, the first pressure is between about 5 Torr and about 50 Torr, and the second pressure is between about 0.1 Torr and about 10 Torr. In yet other embodiments, the first oxygen flow rate is between about 500 sccm and about 2000 sccm, and the second oxygen flow rate is between about 10 sccm and about 300 sccm. In still other embodiments, the seeding layer and the main layer both are chemical vapor deposited at between about 200° C. and about 400° C. In yet other embodiments, the chemical vapor depositing a seeding layer is performed at higher temperature than the chemical vapor depositing the main layer.

Other embodiments of the invention form a layer comprising ruthenium by performing chemical vapor deposition using a ruthenium source and oxygen gas at a chemical vapor deposition flow rate ratio of the ruthenium source to the oxygen gas. The flow rate ratio of the ruthenium source to the oxygen gas then is increased. Yet other embodiments can provide temperatures, pressures and/or flow rates that were described above.

Still other embodiments of the present invention form a layer comprising ruthenium by first performing chemical vapor deposition using a ruthenium source and oxygen gas at a chemical vapor deposition rate that is below a breakpoint where the chemical vapor deposition rate remains constant. Chemical vapor deposition then is performed using a ruthenium source and oxygen gas at a chemical vapor deposition rate that is above the breakpoint. In some embodiments, the chemical vapor deposition rate that is below the breakpoint is substantially higher than the constant chemical vapor deposition rate. Pressures, flow rates and/or temperatures may be provided as was described above. Accordingly, ruthenium layers having good step coverage and good surface morphology may be obtained. Thus, if the layer comprising ruthenium is formed on an underlying layer having a trench, a thin ruthenium layer can be uniformly formed on the sidewalls of the trench, without exposing the underlying layer.

DETAILED DESCRIPTION OF PREFERRED EMBODIMENTS

Figure 1:
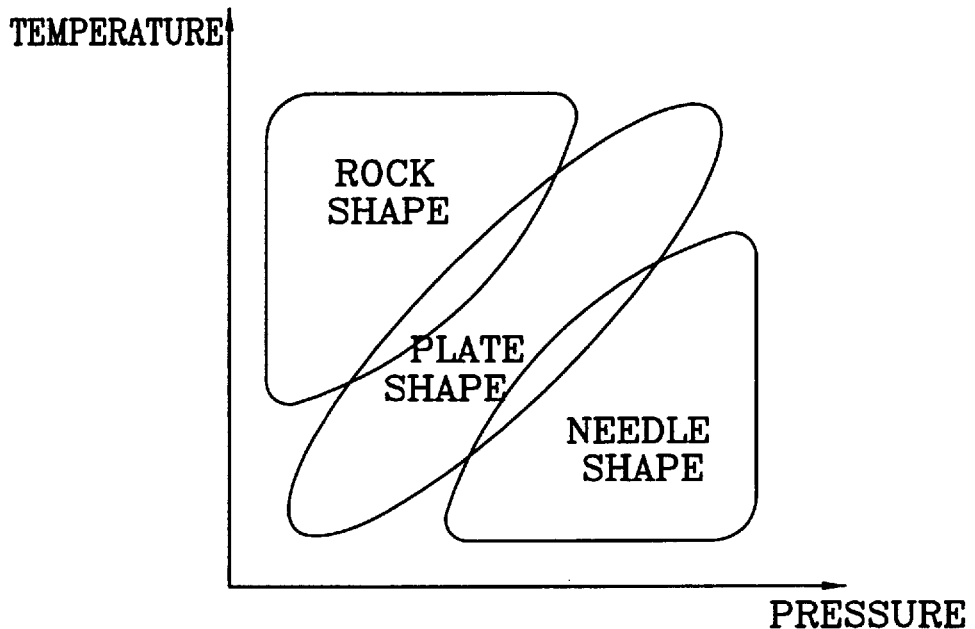
FIG. 1 is a graph illustrating the morphological distributions of ruthenium layers formed by chemical vapor deposition according to changes in the pressure of a chamber and the temperature of a substrate.

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the relative sizes of regions may be exaggerated for clarity. It will be understood that when an element such as a layer, region or substrate is referred to as being "on" another element, it can be directly on the other element or intervening elements may also be present. In contrast, when an element is referred to as being "directly on" another element, there are no intervening elements present.

Figure 2:
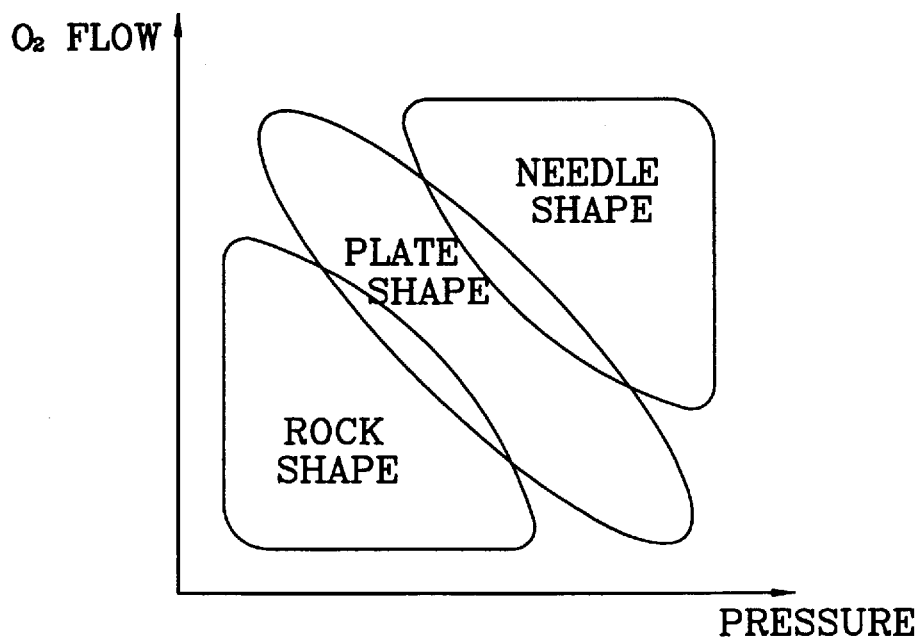
FIG. 2 is a graph illustrating the morphological distributions of ruthenium layers formed by chemical vapor deposition according to changes in the pressure of a chamber and the flow rate of oxygen ($O_2$) gas.
Figure 3A:
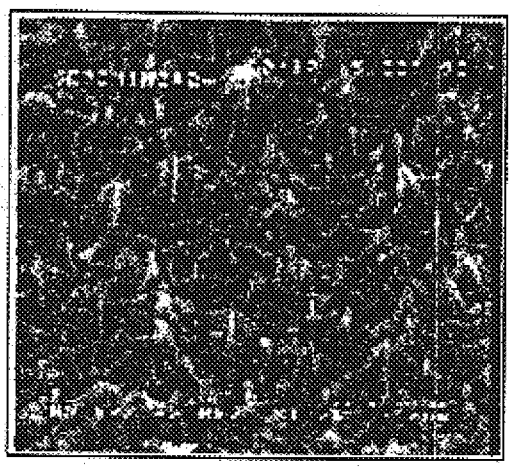
FIGS. 3A through 5B are SEM images of the surfaces and cross sections of ruthenium layers formed under different conditions by chemical vapor deposition.
Figure 3B:

Characteristics of a ruthenium layer formed by chemical vapor deposition first will be described. As shown in FIGS. 1 and 2, when forming a ruthenium layer by chemical vapor deposition, the ruthenium layer generally exhibits a certain shape depending on the temperature and pressure inside a chemical vapor deposition chamber and the flow rate of oxygen gas supplied into the chemical vapor deposition chamber. Thus, as shown in FIGS. 3A and 3B, when the temperature and the pressure inside the chamber are low, a ruthenium layer having plate-shaped seed grains is formed. Moreover, when the flow rate of oxygen gas and the pressure inside the chamber are high, a ruthenium layer having needle-shaped seed grains is formed. The ruthenium layer has a high seed grain density and thus generally has superior step coverage. However, a seed layer formed of such a ruthenium layer may contain impurities, such as oxygen, and thus may show high surface resistance. In addition, the seed layer generally has many peaked portions of seed grains, and thus if the seed layer is used as an electrode of a capacitor, leakage current may occur.

Figure 5A:
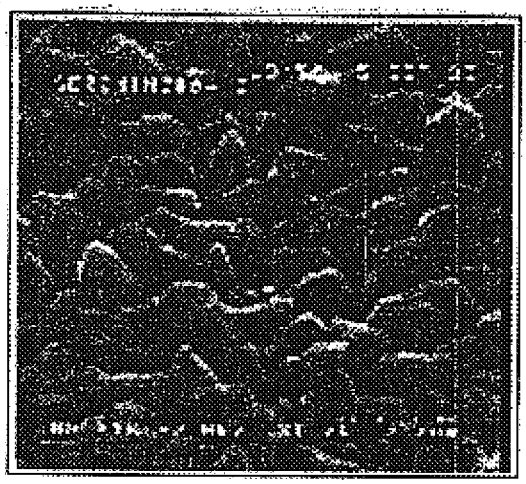
Figure 5B:
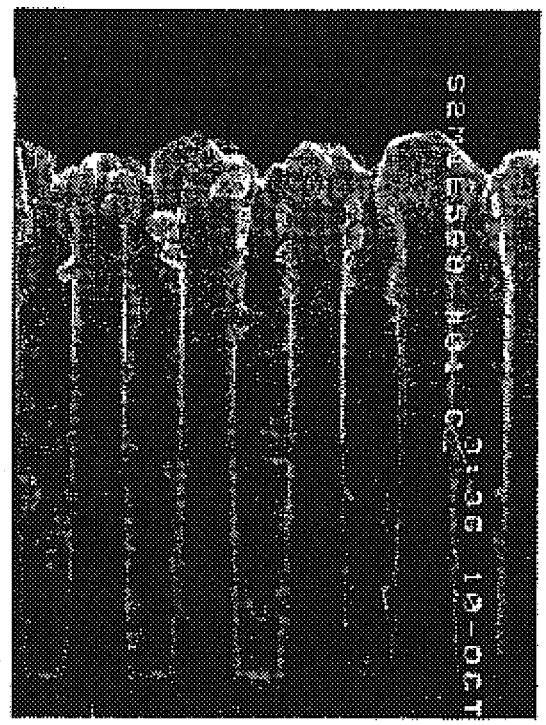

On the other hand, when the temperature of a substrate and the pressure inside the chamber are high, a ruthenium layer having plate-shaped seed grains is formed. Moreover, when the flow rate of oxygen gas supplied into the chamber and the pressure inside the chamber are low, as shown in FIGS. 5A and 5B, a ruthenium layer having rock-shaped seed grains generally is formed. In such a ruthenium layer, seed grains may uniformly grow in every direction; however, seed grain density generally is very low. Thus, when depositing a thick ruthenium layer, a ruthenium layer having rock-shaped seed grains may have better surface morphology and lower surface resistance than the ruthenium layer with needle-shaped seed grains. However, when depositing a thin ruthenium layer, seed grains generally are loosely scattered about, and thus an underlying layer may be exposed between the seed grains. Thus, a thin ruthenium layer having rock-shaped seed grains may not form a uniform film. In other words, if a thin ruthenium layer having rock-shaped seed grains is formed on an integrated circuit substrate having a trench or a hole, as shown in FIG. 5B, the ruthenium layer may not be uniformly formed on the entire surface of the substrate, and particularly, at the sidewalls of the trench or hole.

Figure 4A:
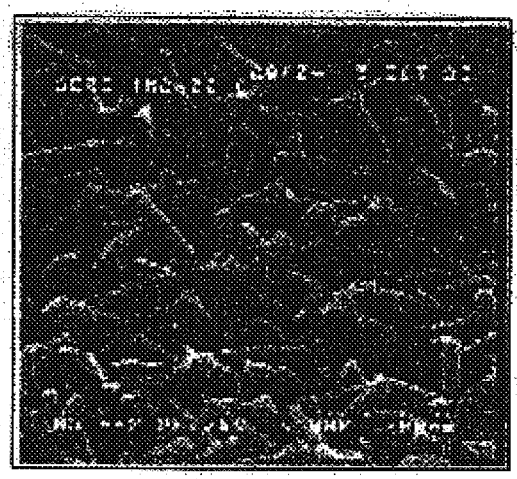
Figure 4B:
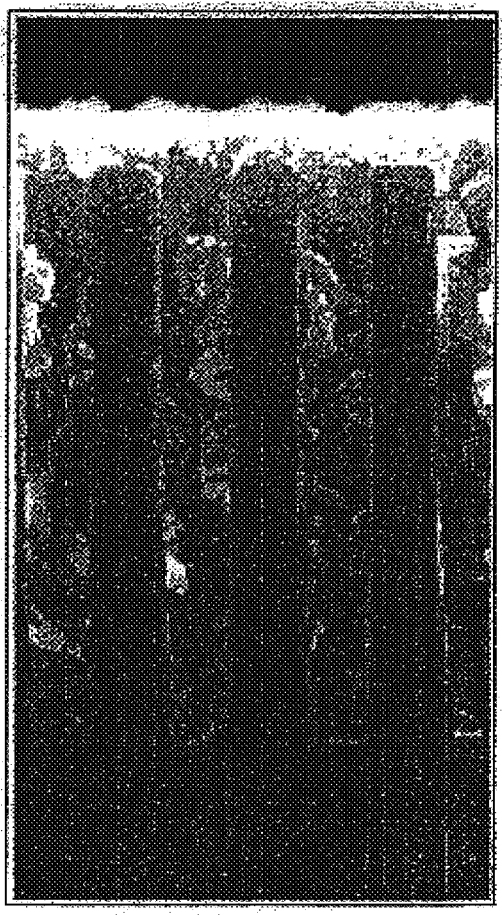

The step coverage of a ruthenium layer having plate-shaped seed grains generally is between the step coverage of a ruthenium layer having needle-shaped seed grains and the step coverage of a ruthenium layer having rock-shaped seed grains. However, when depositing a thin ruthenium layer having plate-shaped seed grains on a substrate having a trench or a hole, as shown in FIG. 4B, the ruthenium layer also may not be uniformly formed on the entire surface of the substrate, and particularly, at the sidewalls of the trench or hole.

As integrated circuit devices become more highly integrated, three-dimensional capacitor electrodes, such as cylindrical capacitor electrodes and/or fin-shaped capacitor electrodes, have been employed in these integrated circuit devices. To realize such three-dimensional capacitor electrodes, it may be desirable to form a film which can exhibit superior step coverage, be uniformly deposited, and show good electrical characteristics. Accordingly, it may be difficult to use a ruthenium layer having needle-shaped, plate-shaped, or rock-shaped seed grains in upper and lower electrodes of a three-dimensional capacitor, a contact plug of a multi-layered metal wiring layer, an upper wiring layer and/or other integrated circuit features.

Figure 6A:
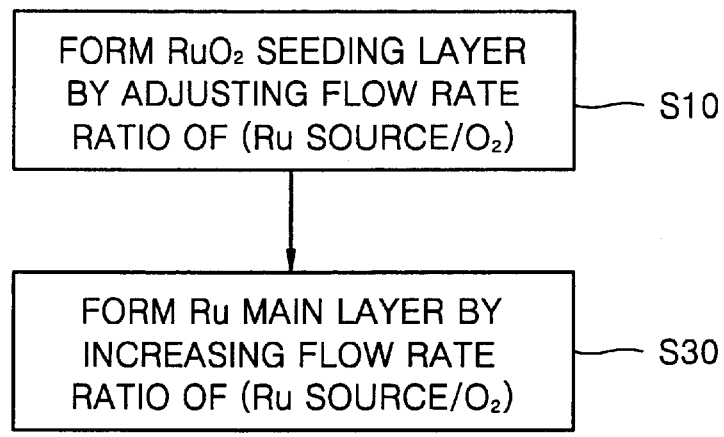
FIG. 6A is a flowchart of methods for depositing a ruthenium layer according to embodiments of the present invention.
Figure 6B:
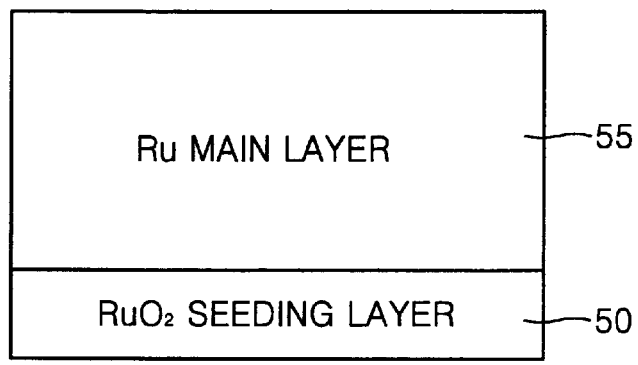
FIG. 6B is a cross-sectional view illustrating a ruthenium layer that can be formed by methods of FIG. 6A according to embodiments of the invention.

As shown in FIGS. 6A and 6B, according to some embodiments of the present invention, a process for depositing a ruthenium layer can be divided into two or more deposition steps with different chemical vapor deposition conditions. In a first deposition step S10, a seeding layer 50 is formed comprising a ruthenium oxide ($RuO_2$) layer wherein the flow rate ratio of a ruthenium source to oxygen ($O_2$) gas is low, in order to form seed grains as densely and uniformly as possible. Next, in a second deposition step S30, a ruthenium main layer 55 is formed on the seeding layer 50 wherein the flow rate ratio of a ruthenium source to oxygen gas is increased from that used in the step S10, so as to uniformly grow seed grains. In some embodiments, the second deposition step S30 is performed in-situ with the first deposition step S10 in the same chamber.

In some embodiments, the seeding layer 50 including a ruthenium oxide layer is not a layer in which oxygen is contained as an impurity, but rather is a layer in which Ru coexists with $RuO_2$.

Methods for forming a seeding layer including a ruthenium oxide layer according to some embodiments of the invention will be described more fully with reference to FIGS. 7, 8A through 8D, 9, and 10.

There are at least three methods for reducing the flow rate ratio of a ruthenium source to oxygen gas including reducing the flow rate of a ruthenium source used in the deposition of a ruthenium layer without changing the flow rate of oxygen gas supplied into a chamber, increasing the flow rate of oxygen gas without changing the flow rate of the ruthenium source, and reducing the flow rate of the ruthenium source while increasing the flow rate of oxygen gas.

Figure 7:
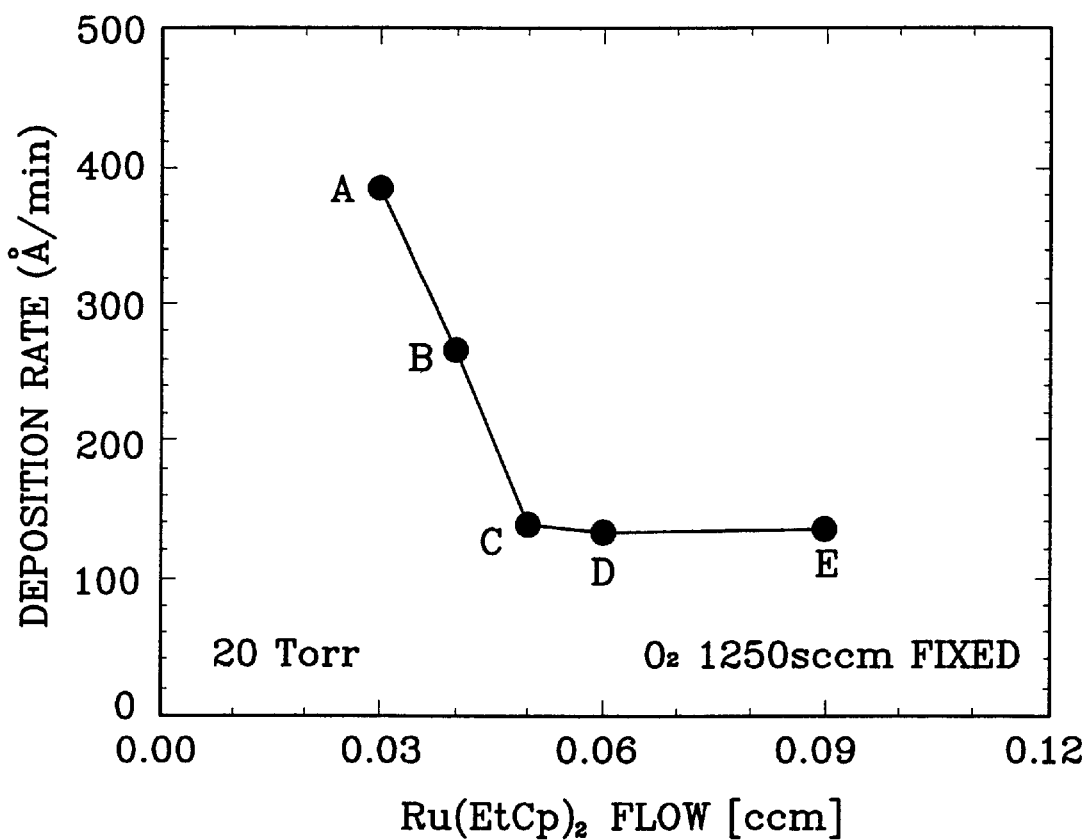
FIG. 7 is a graph showing an example of changes in deposition rate according to changes in the flow rate ratio of a ruthenium source/oxygen gas in a process for forming a seeding layer according to embodiments of the present invention.
Figure 10:
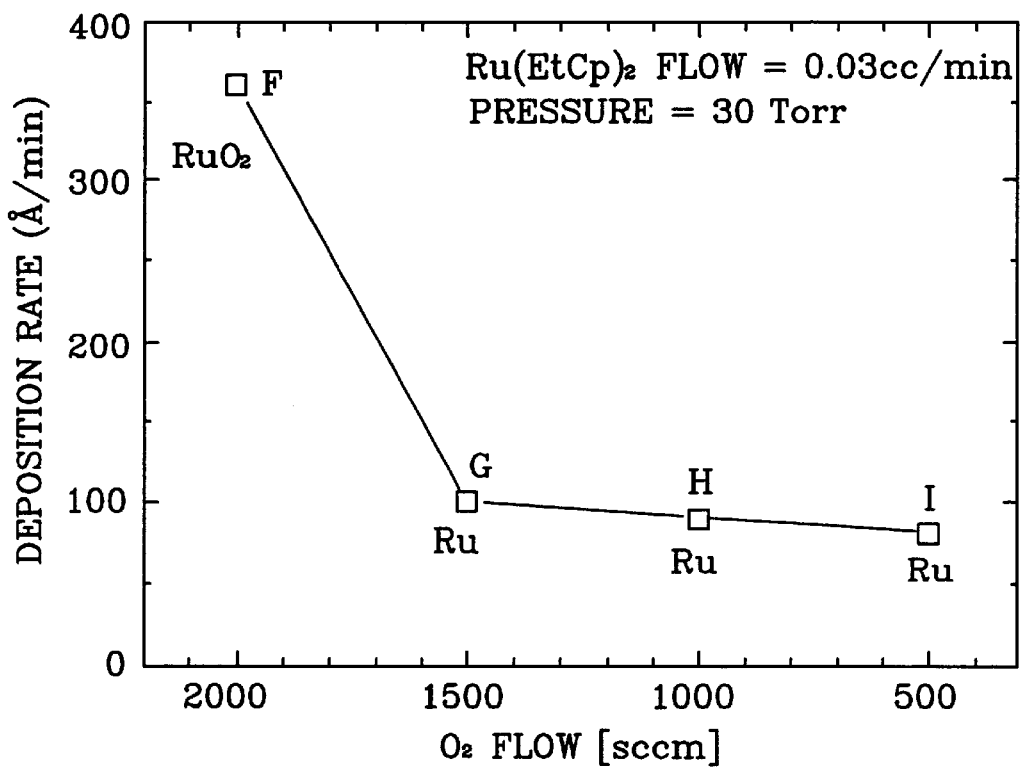
FIG. 10 is a graph showing another example of changes in deposition rate according to changes in the flow rate ratio of a ruthenium source/oxygen gas in forming a seeding layer according to embodiments of the present invention.

FIG. 7 illustrates embodiments of forming a seeding layer using the first method, and FIG. 10 illustrates embodiments of forming a seeding layer using the second method. Gasified $Ru(C_2H_5C_2H_4)_2$, $Ru(C_{11}H_{10}O_2)_3$, $Ru(C_5H_5)_2$, and/or $Ru(CH_3CH_2CH_2CH_2CH_3C_5H_3)_3$ may be used as a ruthenium source. FIGS. 7 and 10 show the results for embodiments of forming a seeding layer using $Ru(C_2H_5C_2H_4)_2$ (hereinafter, referred to as $Ru(EtCp)_2$) as a ruthenium source.

FIG. 7 graphically illustrates changes in the deposition rate (or deposition thickness) of a seeding layer in which the flow rate of oxygen gas is maintained at 1250 sccm and the flow rate of a ruthenium source is gradually decreased with a pressure of 20 Torr. Even though the flow rate of the ruthenium source is decreased from 0.09 ccm (state E) to 0.06 ccm (state D), the deposition rate of a seeding layer does not change considerably. If the flow rate of the ruthenium source is decreased from 0.06 ccm (state D) to 0.05 ccm (state C), the deposition rate of a seeding layer only slightly increases. However, if the flow rate of a ruthenium source is reduced below 0.05 ccm (state C), the deposition rate of a seeding layer increases significantly. Thus, point C is an example of a breakpoint flow rate ratio of ruthenium source to oxygen gas, wherein the deposition rate remains constant above the breakpoint flow rate ratio and increases below the breakpoint flow rate ratio.

Figure 8A:
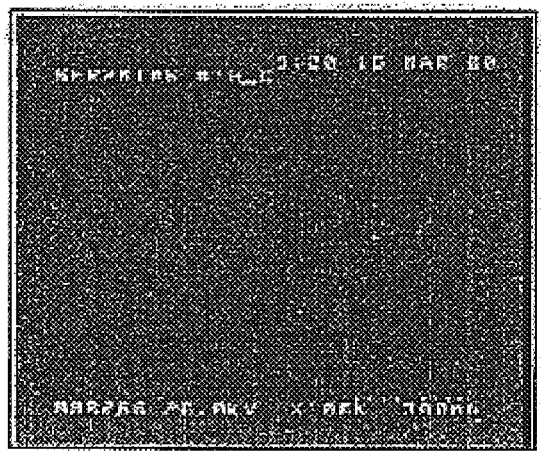
FIGS. 8A through 8D are SEM images of the surfaces of seeding layers formed under the conditions A through D of FIG. 7 according to embodiments of the present invention.
Figure 8B:
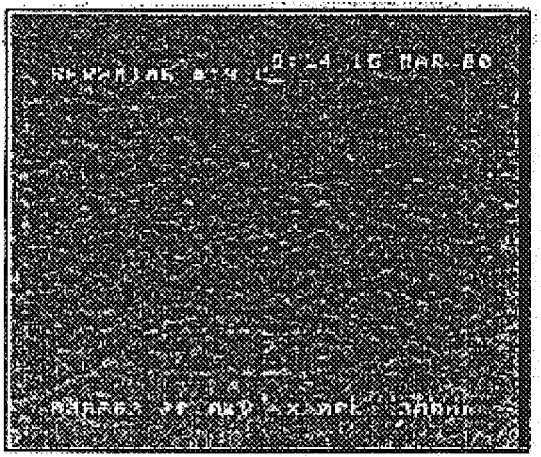
Figure 8C:
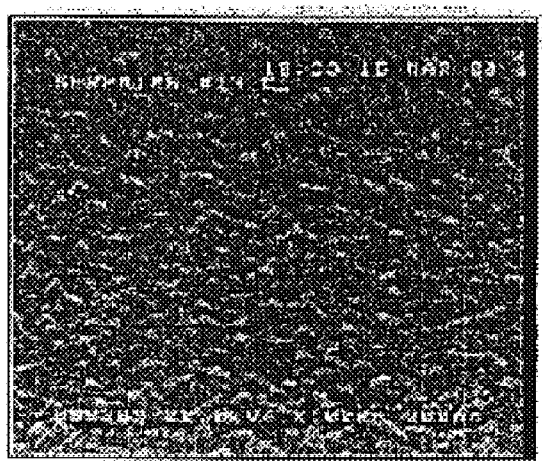
Figure 8D:
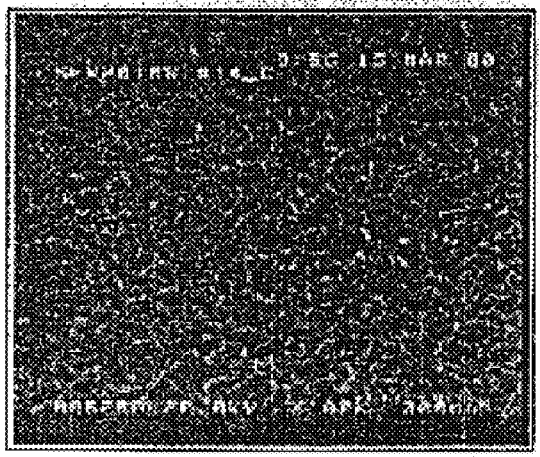

The influence of changes in the deposition rate of a seeding layer on the shape and density of seed grains of the seeding layer will be described. In state D, a seeding layer has needle-shaped seed grains, as shown in FIG. 8D. As described above, a seeding layer having needle-shaped grains generally exhibits a high seed grain density. However, if conditions are changed from state D to state C, the needle-shaped seed grains comprising the seeding layer generally become round, as shown in FIG. 8C. In other words, the number of peaked portions of the seeding layer having needle-shaped seed grains generally is reduced. If the flow rate ratio of a ruthenium source to oxygen gas is further reduced, the rock-shaped seed grains generally become smaller. In other words, grain size generally is reduced, as shown in FIGS. 8A and 8B which show seeding layers formed under the conditions of states A and B, respectively. Accordingly, the seed grain density generally increases, and the seed grains generally become round.

As described above, if the flow rate ratio of a ruthenium source to oxygen gas is below a predetermined level, a seeding layer comprised of uniform-sized seed grains generally is formed. In other words, the morphology and step coverage of the seeding layer generally can be good.

Next, a ruthenium main layer is formed on the seeding layer described above, in which case the flow rate ratio of a ruthenium source to oxygen gas is greater than that applied to the formation of the seeding layer. Since the ruthenium main layer is formed on the seeding layer having good morphology and good step coverage, the ruthenium main layer also can have good morphology and step coverage. In addition, the seed grains of the seeding layer do not have peaked portions and are almost round. Thus, even if a ruthenium layer including such a seeding layer is used for the upper and lower electrodes of a capacitor or an upper wiring layer of a multi-layered metal wiring layer, the probability of leakage current occurring can be reduced considerably.

Figure 9:
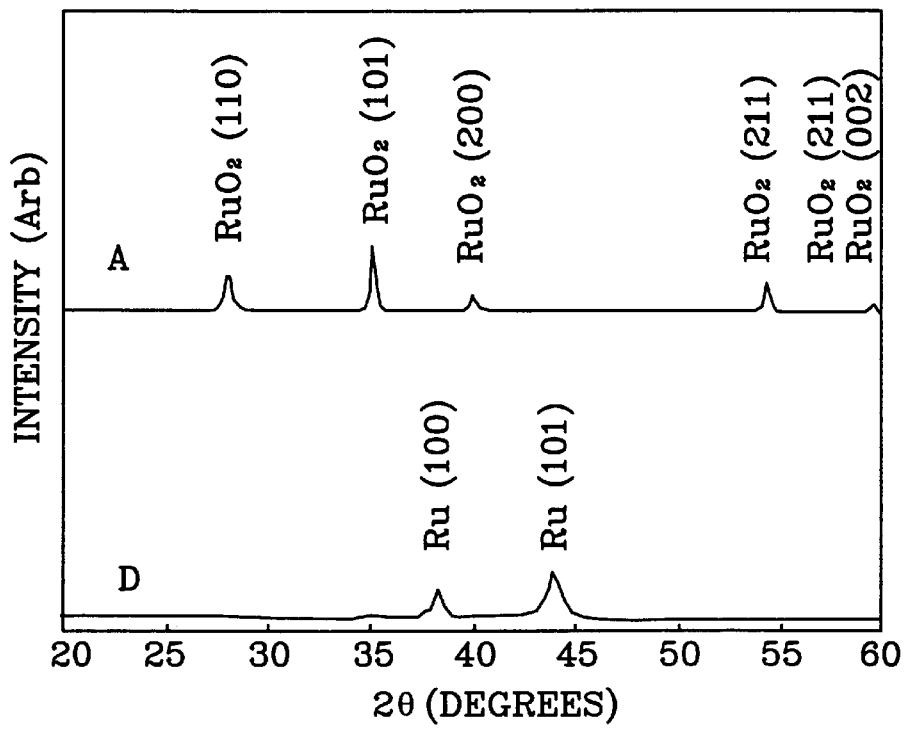
FIG. 9 is a graph illustrating the results of X-ray diffraction analysis of seeding layers formed under the conditions A through D of FIG. 7 according to embodiments of the present invention.

FIG. 9 illustrates exemplary results of diffraction analysis of layers formed under the conditions of states A and D of FIG. 7. Referring to FIG. 9, the layer formed in the state A is a ruthenium oxide layer, and the layer formed under the conditions of state D is a ruthenium layer.

FIG. 10 shows changes in the deposition thickness of a seeding layer formed by second methods for reducing the flow rate ratio of a ruthenium source to oxygen gas two times. In these embodiments, to observe the change of the deposition rate (or deposition thickness) of a seeding layer, the flow rate of $Ru(EtCp)_2$ is fixed to 0.03 ccm under a pressure of 30 Torr and the flow rate of oxygen gas is gradually increased. When the flow rate of oxygen gas is increased from 500 sccm (state I) to 1000 sccm (state H) or 1500 sccm (state G), the deposition thickness of a seeding layer slightly increases. As shown in FIG. 10, in state F, at which the deposition thickness of a seeding layer dramatically changes, a ruthenium oxide layer can be formed, and in the other states G, H, and I, a ruthenium layer can be formed. Thus, point G is an example of a breakpoint flow rate ratio of ruthenium source to oxygen gas, wherein the deposition rate remains constant above the breakpoint flow rate ratio and increases below the breakpoint flow rate ratio. As shown in FIGS. 7, 8A through 8D, and 9, in a case where a ruthenium oxide layer is formed, seed grains generally are densely formed and none of the seed grains appears to have a peaked portion. In other words, even if the flow rate of oxygen gas is increased and the flow rate of the ruthenium source is fixed, it is possible to form a seeding layer to show good surface morphology and superior step coverage.

The results of FIGS. 7 and 10 show that the flow rates of the ruthenium source and oxygen gas can influence the morphology and step coverage of a seeding layer. Accordingly, in other embodiments of the present invention, when increasing the flow rate of oxygen gas while decreasing the flow rate of the ruthenium source, it is also possible to form a seeding layer that can have good surface morphology and superior step coverage.

The conditions under which a ruthenium oxide layer can be formed during the formation of a seeding layer, for example, the time when the deposition rate of a seeding layer dramatically changes, may be varied depending on the structure of the deposition chamber, the pressure inside the deposition chamber, the temperature of the substrate in the deposition chamber, the kind of ruthenium source used and/or other parameters.

In other embodiments, to increase the density of seed grains formed in a seeding layer further, the pressure of a deposition chamber used for the formation of a seeding layer may be maintained higher than for the formation of a ruthenium main layer, and the flow rate of oxygen gas in the formation of the seeding layer can be adjusted to be greater than the flow rate of oxygen gas in the formation of the ruthenium main layer. For example, in some embodiments, in the formation of a seeding layer, the pressure of the chamber is maintained at a range between about 5 Torr and about 50 Torr, and the flow rate of oxygen gas is maintained at a range between about 500 sccm and about 2000 sccm. In other embodiments, in the formation of the ruthenium main layer, the pressure of the chamber is maintained at a range of about 0.1 Torr and about 10 Torr, and the flow rate of oxygen gas is maintained at a range between about 10 sccm and about 300 sccm.

In addition, in other embodiments, to increase the density of seed grains formed in the seeding layer, the temperature of a substrate during the formation of a seeding layer can be set below the temperature of the substrate during the formation of a ruthenium main layer within a predetermined temperature range.

Specifically, in embodiments of forming a seeding layer containing $RuO_2$ shown in FIG. 7, the flow rate ratio of a ruthenium source to oxygen gas may be less than about 0.05/1250 or about $4\times10^{-5}$. In the case of forming a seeding layer containing $RuO_2$ shown in FIG. 10, the flow rate ratio of a ruthenium source to oxygen gas may be less than about $4\times10^{-5}$.

In still other embodiments, the pressure and temperature of the chemical vapor deposition chamber are preferably about 5–50 Torr and about 200–400° C., respectively, in which case a seeding layer may be formed to a thickness of no greater than about 300 Å. In other embodiments, the seeding layer may be 100 Å or less in thickness. In order to form a ruthenium main layer on these seeding layers, the pressure of the chemical vapor deposition chamber may be adjusted to between about 20 Torr and about 30 Torr. In other embodiments, the temperature of the substrate in the reaction chamber during the formation of a ruthenium main layer is within the same range as during the formation of a seeding layer. In still other embodiments, the temperature is adjusted to be higher than the temperature of the substrate during the formation of a seeding layer. In addition, the pressure inside the reaction chamber may be adjusted to about 0.5–5 Torr. In embodiments where $Ru(EtCp)_2$ is used as a ruthenium source and a conventional shower head type of reaction chamber is used, the temperature of a substrate in the reaction chamber may be adjusted to between about 270° C. and about 350° C., and the pressure of the reaction chamber may be adjusted to within a range between about 0.5 Torr and about 5 Torr.

Figure 11A:
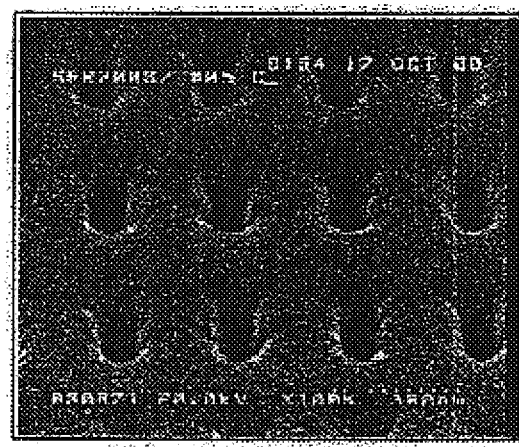
FIGS. 11A and 11B are SEM images of the surface and cross section, respectively, of a ruthenium layer formed on an underlying layer including a trench according to embodiments of the present invention.
Figure 11B:
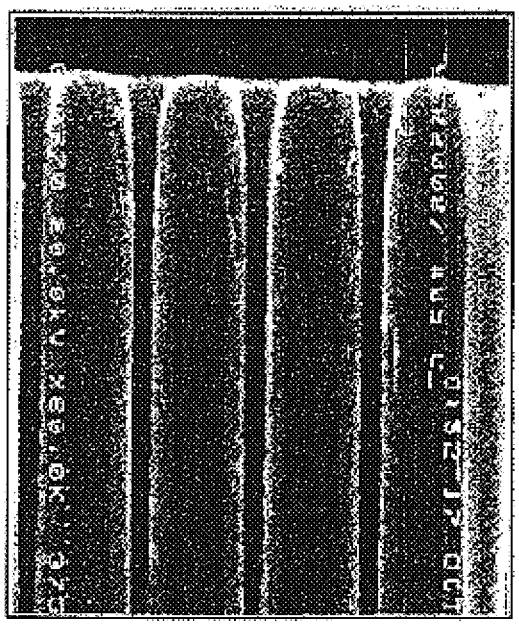

FIGS. 11A and 11B are SEM images of the surface and cross section, respectively, of a ruthenium layer formed on a patterned substrate, which includes a trench, according to embodiments of the present invention. In these embodiments, a seeding layer containing $RuO_2$ was formed at a temperature of 320° C. and a pressure of 20 Torr with a $Ru(EtCp)_2$ flow rate of 0.03 ccm and an oxygen gas flow rate of 1250 sccm for 20 seconds, and a ruthenium main layer was formed at a temperature of 320° C. and a pressure of 0.5 Torr with a $Ru(EtCp)_2$ flow rate of 0.045 ccm and an oxygen gas flow rate of 45 sccm for 4 minutes. As shown in FIGS. 11A and 11B, the ruthenium layer is uniformly deposited on the sidewalls of a deep trench without exposing an underlying layer.

According to some embodiments of the present invention, it is possible to form a seeding layer, including a ruthenium oxide layer, whose step coverage and morphology can be good, by reducing the flow rate ratio of a ruthenium source to oxygen gas supplied into a chemical vapor deposition chamber. Accordingly, it is possible to deposit a ruthenium layer exhibiting superior morphology and step coverage on underlying layers including a trench or hole. For example, if upper and lower electrodes of a cylindrical or fin-shaped capacitor are formed of a ruthenium layer according to embodiments of the present invention, it is possible to form a capacitor having good morphology and step coverage while reducing leakage current.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of forming a layer comprising ruthenium, the method comprising:
    chemical vapor depositing a seeding layer comprising ruthenium oxide on a substrate at a chemical vapor deposition flow rate ratio of a ruthenium source to oxygen gas; and
    chemical vapor depositing a main layer comprising ruthenium on the seeding layer comprising ruthenium oxide by increasing the chemical vapor deposition flow rate ratio of the ruthenium source to the oxygen gas.

2. A method according to claim 1:
    wherein a chemical deposition rate remains constant above a breakpoint flow rate ratio of the ruthenium source to the oxygen gas and increases below the breakpoint flow rate ratio;
    wherein the chemical vapor depositing a seeding layer comprises chemical vapor depositing a seeding layer comprising ruthenium oxide on a substrate at a chemical vapor deposition flow rate ratio of a ruthenium source to oxygen gas that is below the breakpoint flow rate ratio; and
    wherein the chemical vapor depositing a main layer comprises chemical vapor depositing a main layer comprising ruthenium on the seeding layer by increasing the chemical vapor deposition flow rate ratio of the ruthenium source to the oxygen gas to above the breakpoint flow rate ratio.

3. A method according to claim 1 wherein the chemical vapor depositing a main layer comprising ruthenium on the seeding layer comprises adjusting the flow rate of at least one of the ruthenium source and the oxygen gas.

4. A method according to claim 1:
    wherein the chemical vapor depositing a seeding layer comprises chemical vapor depositing a seeding layer at a first pressure and at a first oxygen gas flow rate; and
    wherein the chemical vapor depositing a main layer comprises chemical vapor depositing a main layer at a second pressure that is less than the first pressure and at a second oxygen flow rate that is less than the first oxygen flow rate.

5. A method according to claim 4 wherein the first pressure is between about 5 Torr and about 50 Torr and wherein the second pressure is between about 0.1 Torr and about 10 Torr.

6. A method according to claim 4 wherein the first oxygen flow rate is between about 500 sccm and about 2000 sccm and wherein the second oxygen flow rate is between about 10 sccm and about 300 sccm.

7. A method according to claim 1 wherein the chemical vapor depositing a seeding layer and the chemical vapor depositing a main layer are both performed at between about 200° C. and about 400° C.

8. A method according to claim 4 wherein the chemical vapor depositing a seeding layer and the chemical vapor depositing a main layer are both performed at between about 200° C. and about 400° C.

9. A method according to claim 8 wherein the chemical vapor depositing a seeding layer is performed at higher temperature than the chemical vapor depositing a main layer.

10. A method according to claim 1 wherein the ruthenium source gas comprises at least one of gasified $Ru(C_2H_5C_2$ $H_4)_2$, $Ru(C_{11}H_{10}O_2)_3$, $Ru(C_5H_5)_2$, or $Ru(CH_3CH_2CH_2CH_2CH_3C_5H_3)_3$.

11. A method according to claim 1 wherein the chemical vapor depositing a seeding layer comprises chemical vapor depositing a seeding layer comprising ruthenium oxide on a substrate at a chemical vapor deposition flow rate ratio of a ruthenium source comprising $Ru(C_2H_5C_2H_4)_2$ to oxygen gas that is no greater than $6\times10^{-5}$ sccm.

12. A method of forming a layer comprising ruthenium, the method comprising:

first performing chemical vapor deposition using a ruthenium source and oxygen gas at a chemical vapor deposition rate that is below a breakpoint where the chemical vapor deposition rate remains constant; and then performing chemical vapor deposition using a ruthenium source and oxygen gas at a chemical vapor deposition rate that is above the breakpoint where the chemical vapor deposition rate remains constant.

13. A method according to claim 12 wherein the chemical vapor deposition rate that is below the breakpoint where the chemical vapor deposition rate remains constant is a chemical vapor deposition rate that is substantially higher than the constant chemical vapor deposition rate.

14. A method according to claim 12:

wherein the first performing comprises performing chemical vapor deposition at a first pressure and at a first oxygen gas flow rate; and wherein the then performing comprises then performing chemical vapor deposition at a second pressure that is less than the first pressure and at a second oxygen flow rate that is less than the first oxygen flow rate.

* * * * *